US011526651B1

(12) United States Patent
Venton et al.

(10) Patent No.: US 11,526,651 B1
(45) Date of Patent: Dec. 13, 2022

(54) PREDICTIVE ANTENNA DIODE INSERTION IN A MACRO HAVING A CLOCK MESH

(71) Applicant: International Business Machines Corporation, Armonk, NY (US)

(72) Inventors: Amanda Christine Venton, Austin, TX (US); Bijian Chen, Austin, TX (US); Eric Chien Lai, Cedar Park, TX (US); Peter Milton Nasveschuk, Yarmouth, ME (US)

(73) Assignee: International Business Machines Corporation, Armonk, NY (US)

( * ) Notice: Subject to any disclaimer, the term of this patent is extended or adjusted under 35 U.S.C. 154(b) by 7 days.

(21) Appl. No.: 17/400,556

(22) Filed: Aug. 12, 2021

(51) Int. Cl.
*G06F 30/398* (2020.01)
*G06F 30/31* (2020.01)
*G06F 30/394* (2020.01)
*G06F 30/396* (2020.01)
*G06F 30/39* (2020.01)
*G06F 30/392* (2020.01)

(52) U.S. Cl.
CPC ............ *G06F 30/398* (2020.01); *G06F 30/31* (2020.01); *G06F 30/39* (2020.01); *G06F 30/392* (2020.01); *G06F 30/394* (2020.01); *G06F 30/396* (2020.01)

(58) Field of Classification Search
CPC ..................................................... G06F 30/398
USPC ........................................................ 716/115
See application file for complete search history.

(56) References Cited

U.S. PATENT DOCUMENTS

| 5,987,086 | A | 11/1999 | Raman et al. |
| 6,502,229 | B2 | 12/2002 | Lee et al. |
| 7,302,663 | B1* | 11/2007 | Gan ........................ G06F 30/30 716/112 |
| 8,999,766 | B2 | 4/2015 | Su et al. |
| 11,003,829 | B2* | 5/2021 | Yu ........................ H01L 27/0255 |
| 2014/0159157 | A1 | 6/2014 | Jensen et al. |

FOREIGN PATENT DOCUMENTS

WO     2016204866 A1    12/2016

* cited by examiner

*Primary Examiner* — Eric D Lee
(74) *Attorney, Agent, or Firm* — Cantor Colburn LLP; Kelsey M. Skodje (57) ABSTRACT

Embodiments of the invention include protecting against antenna violations in a macro having a clock mesh. Aspects include obtaining a design of the macro, the design including a clock layer having a plurality of clock pins and determining a longest vertical wire and a longest horizontal wire allowed based on a design of the clock mesh. Aspects also include identifying, based at least in part on the longest vertical wire and the longest horizontal wire, a plurality of checkbox regions for a clock pin of the plurality of clock pins and calculating a total diffusion area for each of the plurality of checkbox regions. Aspects further include adding, to the design of the macro, an antenna diode to the clock pin based on a determination that the total diffusion area for any of the plurality of checkbox regions is less than a threshold value.

20 Claims, 6 Drawing Sheets

PREDICTIVE ANTENNA DIODE INSERTION IN A MACRO HAVING A CLOCK MESH

BACKGROUND

The present invention generally relates to integrated circuit development, and more specifically, to integrated circuit development using predictive antenna diode insertion in a macro having a clock mesh.

The development of an integrated circuit (i.e., chip) involves several stages from design through fabrication. The chip may be subdivided into hierarchical levels to simplify design and testing tasks at different stages. Generally, a cell or macro may be regarded as a sub-section of the chip. For example, each macro may comprise a number of cells. Once the design is finalized, tests may be completed to ensure that design rules established by a foundry are met prior to fabrication. Design rules may be applied to sections of the chip. For example, a grid may be overlaid on the chip and each section of the grid (i.e., tile) may be checked for complicity with design rules.

During the design of macros, antenna diodes are often manually added to the layout of the macro to provide a contact from a metal layer to a diffusion layer of a device for manufacturing purposes. This contact provides a path for charge generated in long metal lines or in large via areas during manufacturing to be dissipated without damaging a transistor gate or other circuit implemented on a semiconductor substrate. No prior art techniques currently available provide a method for predictively placing antenna diodes using computer software tools to create the layout of the macro.

SUMMARY

Embodiments of the present invention are directed to a method of integrated circuit development using predictive antenna diode insertion in a macro having a clock mesh. A non-limiting example computer-implemented method includes obtaining a design of the macro, the design including a clock layer having a plurality of clock pins and determining a longest vertical wire and a longest horizontal wire allowed based on a design of the clock mesh. The method also includes identifying, based at least in part on the longest vertical wire and the longest horizontal wire, a plurality of checkbox regions for a clock pin of the plurality of clock pins and calculating a total diffusion area for each of the plurality of checkbox regions. The method further includes adding, to the design of the macro, an antenna diode to the clock pin based on a determination that the total diffusion area for any of the plurality of checkbox regions is less than a threshold value.

Other embodiments of the present invention implement features of the above-described method in computer systems and computer program products.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagrams or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

DETAILED DESCRIPTION

As previously noted, integrated circuit development may involve several stages from design through fabrication. As also noted, at one or more stages, the integrated circuit design may be subdivided hierarchically for design or testing tasks. One commonly manually performed design task is the insertion of antenna diodes to fix antenna violations on internal pins, such as clock pins.

The design of clock mesh in a macro can result in segments of the clock that exist only over the airspace of the macro. A via, or other metal, that may create an antenna violation can be added at parent level of hierarchy causing the child layer to check clean but the parent to fail. In addition, an antenna diode cannot be added at this time due to the parent not owning any circuit area to place a diode. Accordingly, embodiments provide systems, methods, and computer program products to predict that an antenna violation may occur once parent via/wires are added and add antenna diodes to clock pins for which an antenna violation may occur. The determination of whether an antenna violation may occur for a clock pin disposed on a clock layer is based on creating a checkbox for a layer above the clock pin and determining a total diffusion area for the checkbox on the clock layer.

Figure 1:
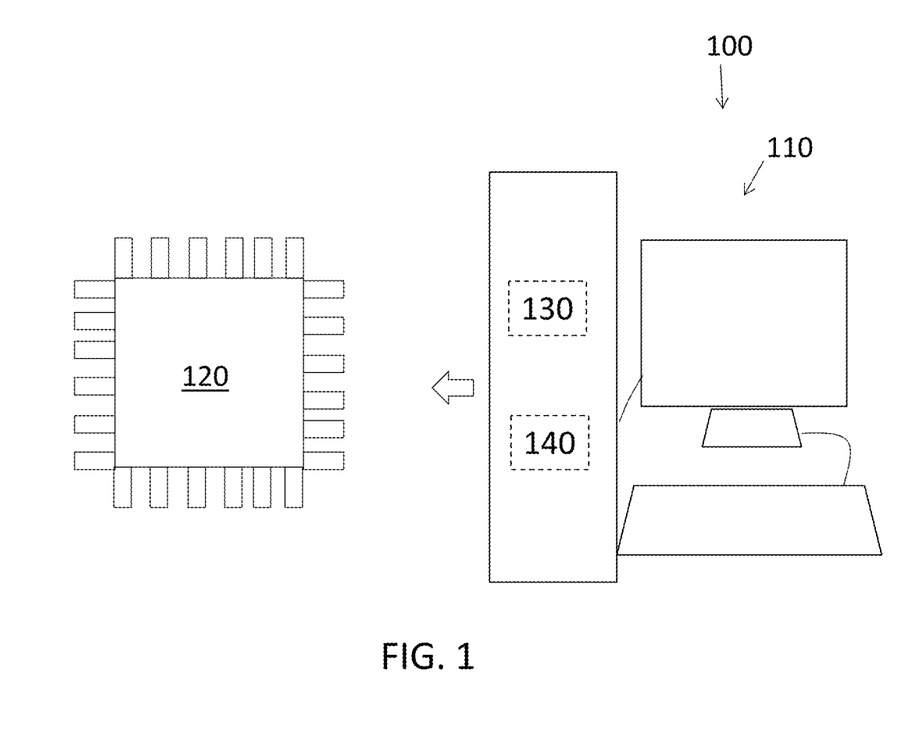
FIG. 1 is a block diagram of a system to perform the development of an integrated circuit using predictive antenna diode insertion in a macro having a clock mesh according to one or more embodiments of the invention.

FIG. 1 is a block diagram of a system 100 to perform predictive antenna diode insertion in a macro having a clock mesh according to embodiments of the invention. The system 100 includes processing circuitry 110 used to generate the design that is ultimately fabricated into an integrated circuit 120. The steps involved in the fabrication of the integrated circuit 120 are well-known and briefly described herein. Once the physical layout is finalized, based, in part, on predictive antenna diode insertion according to embodiments of the invention to facilitate optimization of the routing plan, the finalized physical layout is provided to a foundry. Masks are generated for each layer of the integrated circuit based on the finalized physical layout. Then, the wafer is processed in the sequence of the mask order. The processing includes photolithography and etch. This is further discussed with reference to FIG. 5.

Figure 2:
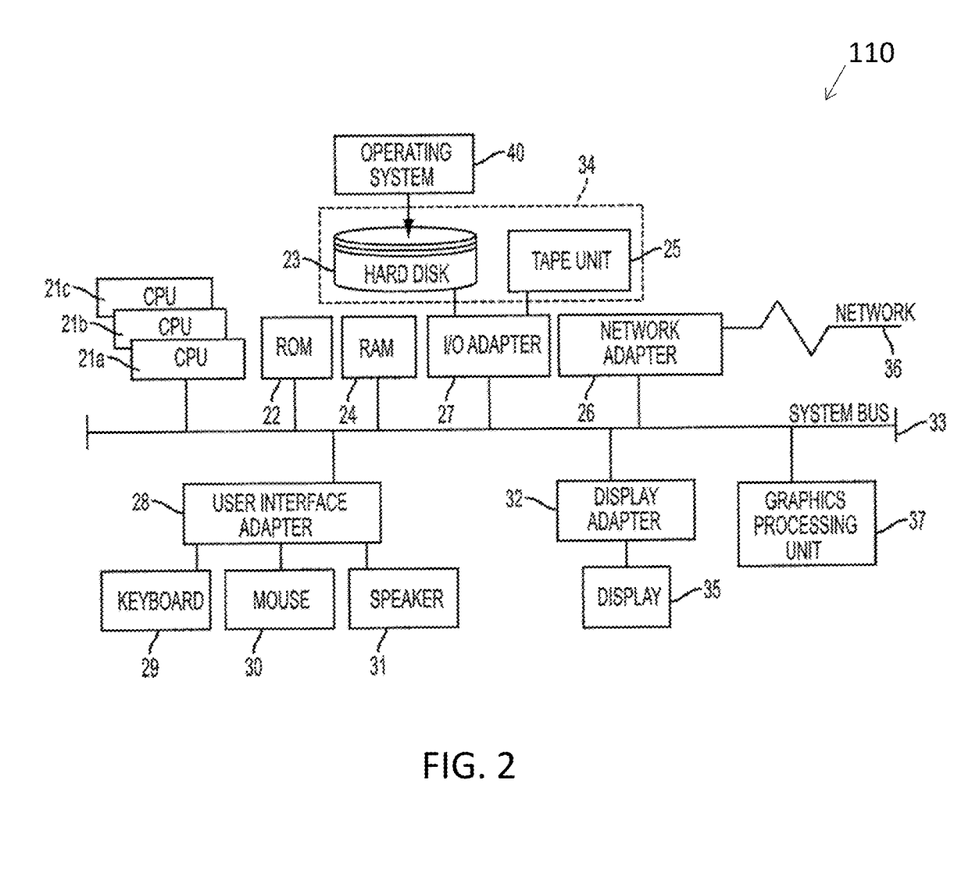
FIG. 2 is a block diagram of a processing system to generate the design that is fabricated into the integrated circuit according to one or more embodiments of the invention.

FIG. 2 is a block diagram of a processing system 110 used to generate the design that is fabricated into the integrated circuit 120. The processing system 110 has one or more central processing units (processors) 21a, 21b, 21c, etc. (collectively or generically referred to as processor(s) 21 and/or as processing device(s)). According to one or more embodiments of the present invention, each processor 21 can include a reduced instruction set computer (RISC) microprocessor. Processors 21 are coupled to system memory (e.g., random access memory (RAM) 24) and various other components via a system bus 33. Read only memory (ROM) 22 is coupled to system bus 33 and can include a basic input/output system (BIOS), which controls certain basic functions of processing system 110.

Further illustrated are an input/output (I/O) adapter 27 and a communications adapter 26 coupled to system bus 33. I/O adapter 27 can be a small computer system interface (SCSI) adapter that communicates with a hard disk 23 and/or a tape storage drive 25 or any other similar component. I/O adapter 27, hard disk 23, and tape storage device 25 are collectively referred to herein as mass storage 34. Operating system 40 for execution on processing system 110 can be stored in mass storage 34. The RAM 22, ROM 24, and mass storage 34 are examples of memory 19 of the processing system 110. A network adapter 26 interconnects system bus 33 with an outside network 36 enabling the processing system 110 to communicate with other such systems.

A display (e.g., a display monitor) 35 is connected to system bus 33 by display adaptor 32, which can include a graphics adapter to improve the performance of graphics intensive applications and a video controller. According to one or more embodiments of the present invention, adapters 26, 27, and/or 32 can be connected to one or more I/O busses that are connected to system bus 33 via an intermediate bus bridge (not shown). Suitable I/O buses for connecting peripheral devices such as hard disk controllers, network adapters, and graphics adapters typically include common protocols, such as the Peripheral Component Interconnect (PCI). Additional input/output devices are shown as connected to system bus 33 via user interface adapter 28 and display adapter 32. A keyboard 29, mouse 30, and speaker 31 can be interconnected to system bus 33 via user interface adapter 28, which can include, for example, a Super I/O chip integrating multiple device adapters into a single integrated circuit.

According to one or more embodiments of the present invention, processing system 110 includes a graphics processing unit 37. Graphics processing unit 37 is a specialized electronic circuit designed to manipulate and alter memory to accelerate the creation of images in a frame buffer intended for output to a display. In general, graphics processing unit 37 is very efficient at manipulating computer graphics and image processing and has a highly parallel structure that makes it more effective than general-purpose CPUs for algorithms where processing of large blocks of data is done in parallel.

Thus, as configured herein, processing system 110 includes processing capability in the form of processors 21, storage capability including system memory (e.g., RAM 24), and mass storage 34, input means such as keyboard 29 and mouse 30, and output capability including speaker 31 and display 35. According to one or more embodiments of the present invention, a portion of system memory (e.g., RAM 24) and mass storage 34 collectively store an operating system such as the AIX® operating system from IBM Corporation to coordinate the functions of the various components shown in the processing system 110.

Figure 3A:
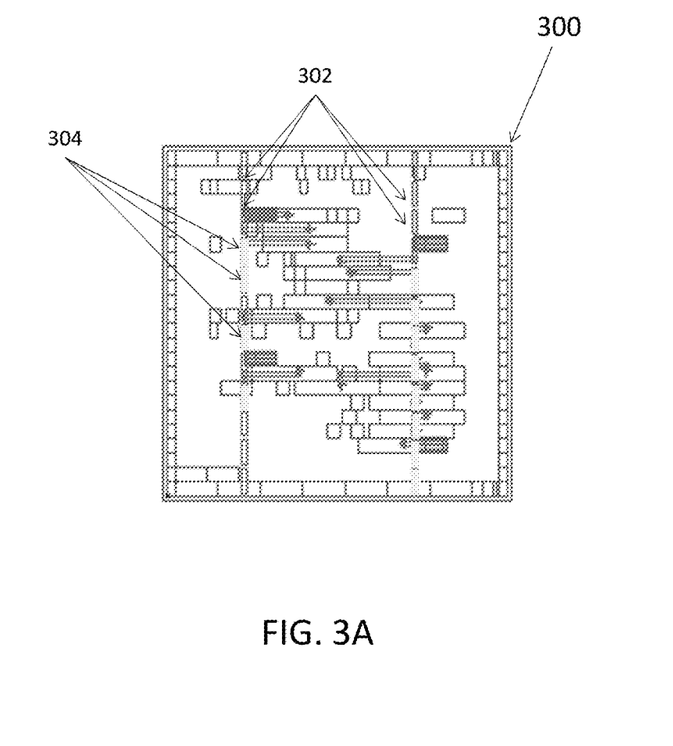
FIG. 3A illustrates a layout diagram of a macro having a clock mesh according to one or more embodiments of the invention.
Figure 3B:
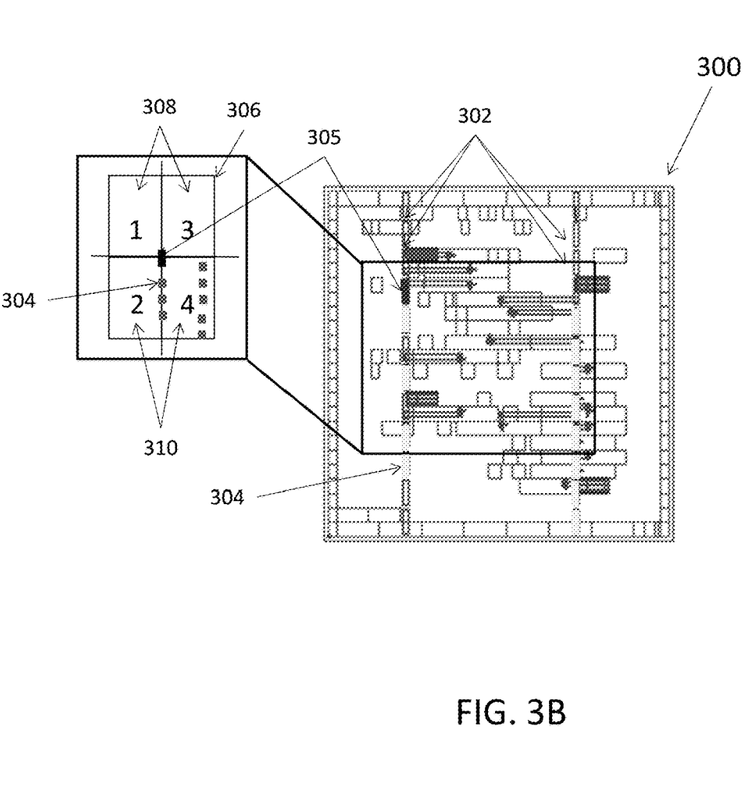
FIG. 3B illustrates a layout diagram of a macro having a clock mesh being evaluated for predictive antenna diode insertion according to one or more embodiments of the invention.
Figure 3C:
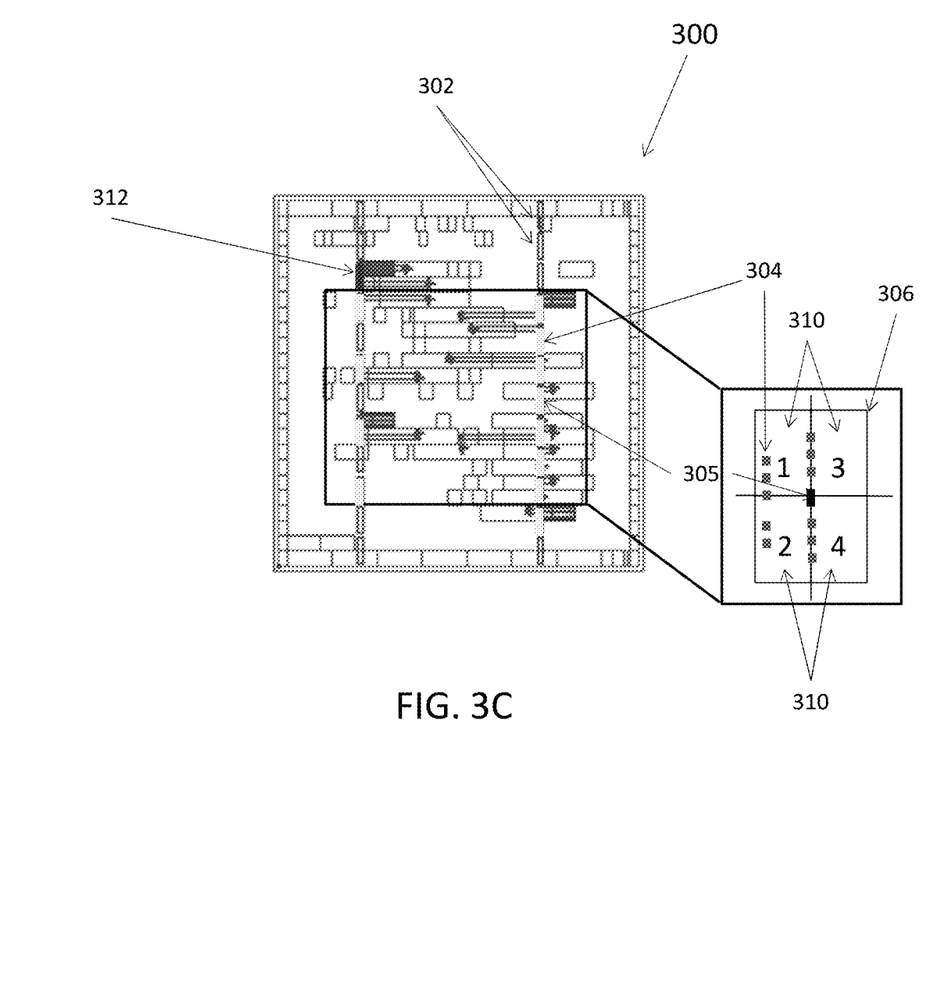
FIG. 3C illustrates a layout diagram of a macro having a clock mesh being evaluated for predictive antenna diode insertion according to one or more embodiments of the invention.

Referring now to FIGS. 3A, 3B, and 3C, schematics diagrams of a macro 300 having a clock mesh according to one or more embodiments of the invention are shown. As shown in FIG. 3A, the macro 300 includes a clock layer having a clock mesh that includes several active clock pins 304 and several inactive clock pins 302. In exemplary embodiments, the macro 300 is evaluated for predictive antenna diode insertion by analyzing a layout of the clock layer. In one embodiment, a portion of the layout of the clock layer around each active clock pins 304 is analyzed to determine if an antenna diode needs to be added to each active clock pin 304.

As shown in FIG. 3B, an active clock pin 305 of the macro 300 is being evaluated for predictive antenna diode insertion. The evaluation of clock pin 305 beings by identifying an area 306 around the clock pin 305. In exemplary embodiments, the area 306 is determined based on the length of the longest horizontal wire and the longest vertical wire that may be connected to the clock pin 305 based on a design of the clock mesh. In one embodiment, the length of the longest horizontal wire and the longest vertical wire that may be connected to the clock pin are obtained based on settings in a design tool that is used to create and edit the macro 300. In one embodiment, the longest horizontal wire and the longest vertical wire are obtained for a layer above the layer of the clock pin 305 in the macro 300.

In exemplary embodiments, the area 306 is subdivided into four regions that have the clock pin 305 as a shared corner. Next, each of the four regions are evaluated to determine a total diffusion area for each of the four regions. In exemplary embodiments, the total diffusion area of a pin is calculated based on physical design checking rules, such as a sum of all gate area and a ratioed driver diffusion area connecting to the pin. The total diffusion area of a region would the sum of the total diffusion area of all clock pins in the region. Note that the gate or driver itself could be outside the region so long as its connected pin is inside. Based on a determination that the total diffusion area for at least one of the four regions is below a threshold value, an antenna diode is added, to the design of the macro, to the clock pin. In one embodiment, the total diffusion area of a region is determined based on the number of active clock pins 304 within the region. As illustrated, regions 310 include several active clock pins 304 other than the clock pin 305 and regions 308 do not include any active clock pins 304 other than the clock pin 305 being evaluated. Since the total diffusion area for regions 308 will be below the threshold value, an antenna diode is added to the design of the macro to the clock pin 305.

As shown in FIG. 3C, an active clock pin 305 of the macro 300 is being evaluated for predictive antenna diode insertion. The evaluation of clock pin 305 beings by identifying an area 306 around the clock pin 305. In exemplary embodiments, the area 306 is subdivided into four regions 310 that have the clock pin 305 as a shared corner. Next, each of the four regions 310 are evaluated to determine a total diffusion area for each of the four regions. As illustrated, regions 310 each include several active clock pins 304 other than the clock pin 305 being evaluated. Since the total diffusion area for regions 310 will be above the threshold value, an antenna diode does not need to be added to the design of the macro to the clock pin 305. Clock pin 312 is illustrated as having already been evaluated and is indicated as having an antenna diode added.

Figure 4:
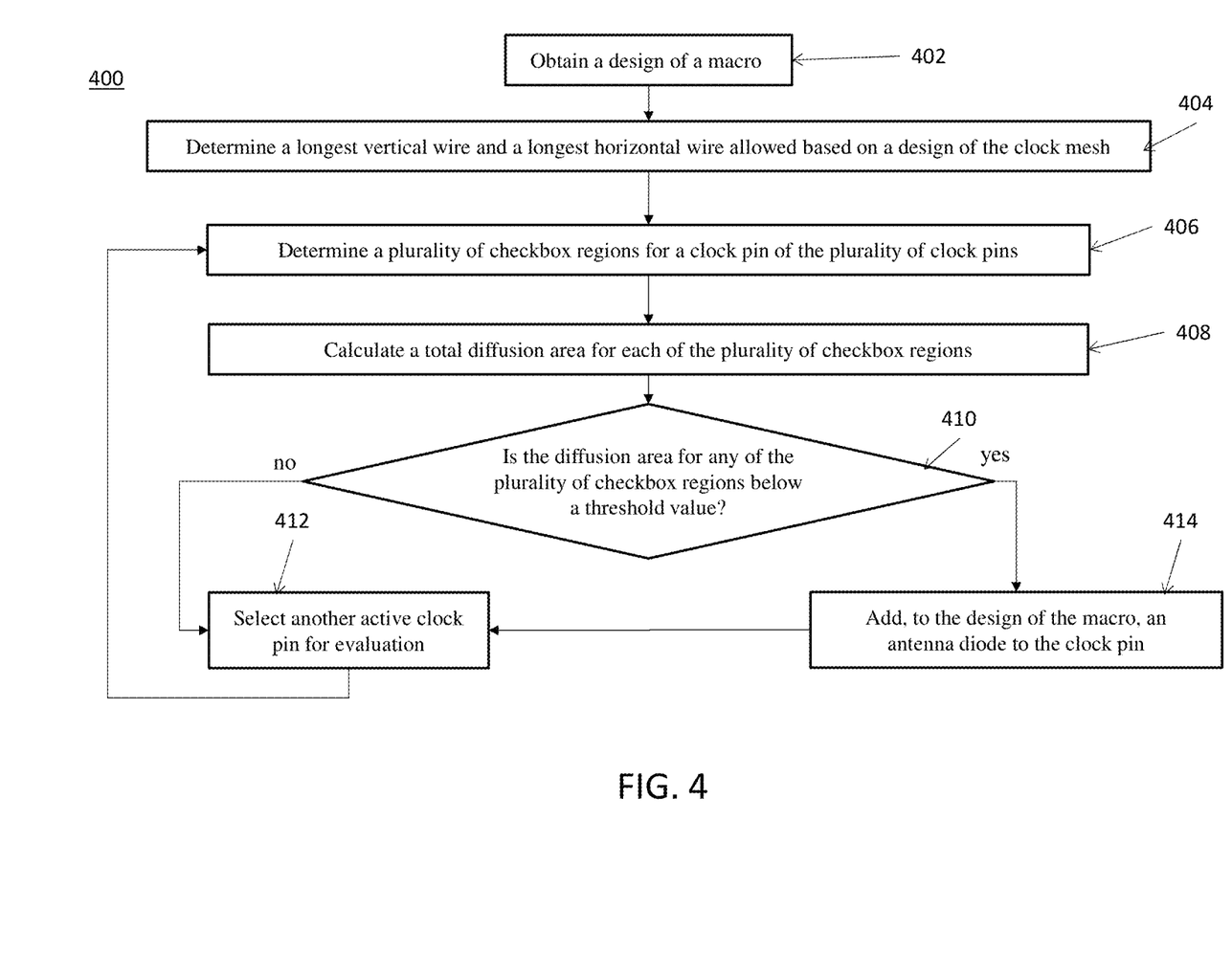
FIG. 4 is a process flow of a method of predictive antenna diode insertion in a macro having a clock mesh in the development of an integrated circuit according to one or more embodiments of the invention.

FIG. 4 is a process flow of a method 400 of predictive antenna diode insertion in a macro having a clock mesh according to exemplary embodiments of the invention. The method 400 begins at block 402 by obtaining a design of a macro. In exemplary embodiments, the macro includes a clock layer having a plurality of clock pins. Next, as shown at block 404 the method 400 includes determining a longest vertical wire and a longest horizontal wire allowed based on a design of the clock mesh. In exemplary embodiments, the longest vertical wire and a longest horizontal wire are obtained via a setting in a macro design tool that is used to create and/or edit the design of the macro. The method 400 also includes determining a plurality of checkbox regions for a first clock pin of the plurality of clock pins, as shown at block 406. In exemplary embodiments, the dimensions of the plurality of checkbox regions are determined based on the longest vertical wire and the longest horizontal wire. In one embodiment, the plurality of checkbox regions includes four checkbox regions.

The method 400 continues at block 408 by calculating a total diffusion area for each of the plurality of checkbox regions. In exemplary embodiments, the total diffusion area for each of the plurality of checkbox regions is proportional to a sum of the gate areas of active clock pins disposed within each of the plurality of checkbox regions. Next, as shown at decision block 410, the method 400 includes determining whether the diffusion area for any of the plurality of checkbox regions is below a threshold value. If the diffusion area for any of the plurality of checkbox regions is below a threshold value, the method 400 proceeds to block 414 and adds, to the design of the macro, an antenna diode to the clock pin. Otherwise, the method 400 proceeds to block 412 and another active clock pin is selected for evaluation. In exemplary embodiments, the threshold value is obtained via a setting in a macro design tool.

While it is often more optimal to fix a clock antenna failure by connecting the antenna diode directly to the clock pin being checked, it is up to the designer on the best way to fix the problem. It is possible to add multiple antenna diodes connecting to new or other existing clock pins and pass the requirements for each of the four checkbox regions. It is also possible to have an excessive number of antennas which can be later removed by checking if each antenna being placed can be removed without failing any of the requirements from any checkbox region from any active clock pins.

Figure 5:
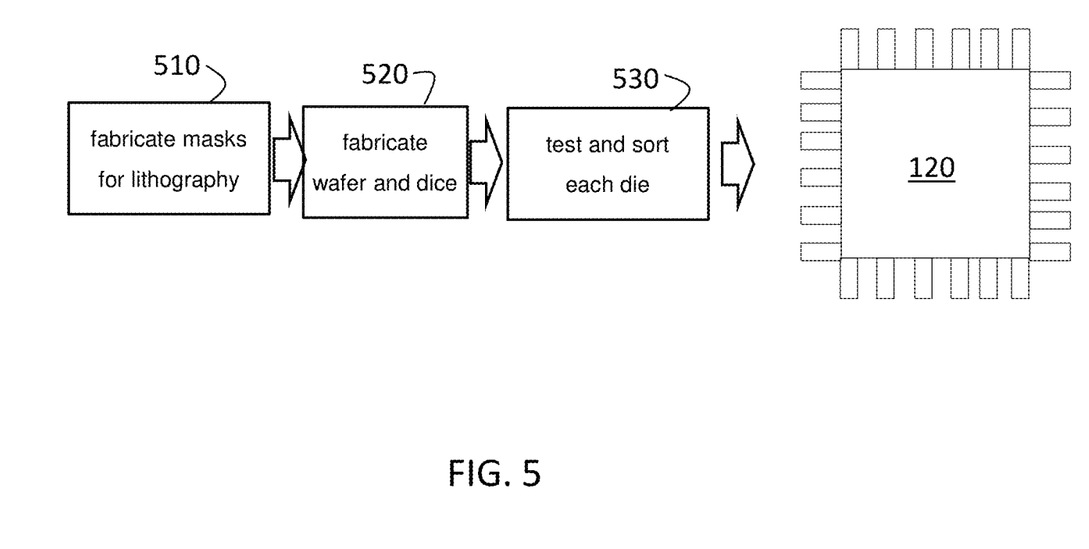
FIG. 5 is a process flow of a method of fabricating the integrated circuit according to exemplary embodiments of the invention.

FIG. 5 is a process flow of a method 500 of fabricating the integrated circuit according to exemplary embodiments of the invention. Once the physical design data is obtained, based, in part, on the processes discussed with reference to FIG. 4, the integrated circuit 120 can be fabricated according to known processes that are generally described with reference to FIG. 5. Generally, a wafer with multiple copies of the final design is fabricated and cut (i.e., diced) such that each die is one copy of the integrated circuit 120. At block 510, the processes include fabricating masks for lithography based on the finalized physical layout. At block 520, fabricating the wafer includes using the masks to perform photolithography and etching. Once the wafer is diced, testing and sorting each die is performed, at block 530, to filter out any faulty die.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

One or more of the methods described herein can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A predictive method for protecting against antenna violations in a macro having a clock mesh, the method comprising:
    obtaining a design of the macro, the design including a clock layer having a plurality of clock pins;
    determining a longest vertical wire and a longest horizontal wire allowed based on a design of the clock mesh;
    identifying, based at least in part on the longest vertical wire and the longest horizontal wire, a plurality of checkbox regions for a clock pin of the plurality of clock pins;
    calculating a total diffusion area for each of the plurality of checkbox regions; and
    adding, to the design of the macro, an antenna diode to the clock pin based on a determination that the total diffusion area for any of the plurality of checkbox regions is less than a threshold value.

2. The method of claim 1, wherein the total diffusion area for each of the plurality of checkbox regions is proportional to a sum of the gate areas of active clock pins disposed within each of the plurality of checkbox regions.

3. The method of claim 1, wherein the plurality of checkbox regions includes four checkbox regions.

4. The method of claim 1, wherein the longest vertical wire and a longest horizontal wire allowed are obtained via a setting in a macro design tool.

5. The method of claim 1, wherein the threshold value is obtained via a setting in a macro design tool.

6. The method of claim 1, wherein each of the plurality of clock pins are active clock pins.

7. The method of claim 1, wherein identifying the plurality of checkbox regions for the clock pin includes calculating dimensions of each of the plurality of checkbox regions based on the longest vertical wire and the longest horizontal wire.

8. A system comprising:
    a memory having computer readable instructions; and
    one or more processors for executing the computer readable instructions, the computer readable instructions controlling the one or more processors to perform operations comprising:
        protecting against antenna violations in a macro having a clock mesh, the method comprising:
        obtaining a design of the macro, the design including a clock layer having a plurality of clock pins;
        determining a longest vertical wire and a longest horizontal wire allowed based on a design of the clock mesh;
        identifying, based at least in part on the longest vertical wire and the longest horizontal wire, a plurality of checkbox regions for a clock pin of the plurality of clock pins;
        calculating a total diffusion area for each of the plurality of checkbox regions; and
        adding, to the design of the macro, an antenna diode to the clock pin based on a determination that the total diffusion area for any of the plurality of checkbox regions is less than a threshold value.

9. The system of claim 8, wherein the total diffusion area for each of the plurality of checkbox regions is proportional to a sum of the gate areas of active clock pins disposed within each of the plurality of checkbox regions.

10. The system of claim 8, wherein the plurality of checkbox regions includes four checkbox regions.

11. The system of claim 8, wherein the longest vertical wire and a longest horizontal wire allowed are obtained via a setting in a macro design tool.

12. The system of claim 8, wherein the threshold value is obtained via a setting in a macro design tool.

13. The system of claim 8, wherein each of the plurality of clock pins are active clock pins.

14. The system of claim 8, wherein identifying the plurality of checkbox regions for the clock pin includes calculating dimensions of each of the plurality of checkbox regions based on the longest vertical wire and the longest horizontal wire.

15. A computer program product comprising a computer readable storage medium having program instructions embodied therewith, the program instructions executable by a processor to cause the processor to perform operations comprising:

protecting against antenna violations in a macro having a clock mesh, the method comprising:

obtaining a design of the macro, the design including a clock layer having a plurality of clock pins;

determining a longest vertical wire and a longest horizontal wire allowed based on a design of the clock mesh;

identifying, based at least in part on the longest vertical wire and the longest horizontal wire, a plurality of checkbox regions for a clock pin of the plurality of clock pins;

calculating a total diffusion area for each of the plurality of checkbox regions; and adding, to the design of the macro, an antenna diode to the clock pin based on a determination that the total diffusion area for any of the plurality of checkbox regions is less than a threshold value.

16. The computer program product of claim 15, wherein the total diffusion area for each of the plurality of checkbox regions is proportional to a sum of the gate areas of active clock pins disposed within each of the plurality of checkbox regions.

17. The computer program product of claim 15, wherein the plurality of checkbox regions includes four checkbox regions.

18. The computer program product of claim 15, wherein the longest vertical wire and a longest horizontal wire allowed are obtained via a setting in a macro design tool.

19. The computer program product of claim 15, wherein the threshold value is obtained via a setting in a macro design tool.

20. The computer program product of claim 15, wherein each of the plurality of clock pins are active clock pins.

* * * * *